(12) United States Patent
Brown et al.

(10) Patent No.: US 6,792,578 B1
(45) Date of Patent: Sep. 14, 2004

(54) HARD MACRO HAVING AN ANTENNA RULE VIOLATION FREE INPUT/OUTPUT PORTS

(75) Inventors: Jeffrey S. Brown, Fort Collins, CO (US); Craig R. Chafin, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/878,499

(22) Filed: Jun. 11, 2001

(51) Int. Cl.⁷ .......................... G06F 17/50; G01R 31/26; H01L 23/62
(52) U.S. Cl. ................. 716/2; 716/17; 438/14; 257/355; 257/356
(58) Field of Search .................. 716/2, 17, 12, 716/1; 438/14; 257/355, 356

(56) References Cited

U.S. PATENT DOCUMENTS

| | | | |
|---|---|---|---|
| 5,654,897 A | | 8/1997 | Tripathi et al. ............. 364/489 |
| 6,130,460 A | * | 10/2000 | Borel ......................... 257/356 |
| 6,194,233 B1 | * | 2/2001 | Bedner et al. ................ 438/14 |
| 6,624,480 B2 | * | 9/2003 | Lin et al. .................... 257/355 |
| 2002/0184601 A1 | * | 12/2002 | Fitzhenry et al. .............. 716/1 |

FOREIGN PATENT DOCUMENTS

TW          241391     *  2/1995   ........... H01L/27/10

* cited by examiner

Primary Examiner—A. M. Thompson
(74) Attorney, Agent, or Firm—Westman, Champlin & Kelly

(57) ABSTRACT

Disclosed is an improved hard macro design for use in an ASIC, which avoids undesirable buildup of electrostatic charge on a gate of an I/O transistor of the hard macro. The hard macro includes a port level metallic conductor of an I/O port positioned at a low level metalization layer and an electrical connection between the port level metallic conductor and a gate conductor of the I/O transistor. The electrical connection includes a first conducting section extending from the gate conductor to a top level metallic conductor at a highest level metalization layer and a second conducting section extending from the top level metallic conductor layer to the port level conductor. Antenna rule violations at the I/O port of the hard macro are eliminated due to the electrical connection between the top level metallic conductor and a diffusion region.

5 Claims, 2 Drawing Sheets

HARD MACRO HAVING AN ANTENNA RULE VIOLATION FREE INPUT/OUTPUT PORTS

BACKGROUND OF THE INVENTION

The present invention relates to hard macros used in Application Specific Integrated Circuits (ASIC). More particularly, the present invention relates to eliminating antenna rule violations when routing signals to hard macro input ports, while enhancing failure analysis capability of the hard macros.

In the ASIC environment for manufacturing custom logic circuits, hard macros are integrated in a custom circuit and interconnected by metal wiring layers. A hard macro is generally a component that can be dropped into the circuit layout to perform a desired function. Examples of hard macros include processors including processor cores, memory arrays, input and output interface circuits, encoders, decoders and other types of circuit blocks.

A Reactive Ion Etch (RIE) process is generally used to establish the desired electrical connections of a layer. The RIE process may result in electrostatic charge being built up on the metal lines of each layer, which may be applied to the transistor gates of an input of the hard macro, which can permanently damage the transistor. However, the top metalization layer of the integrated circuit is ultimately connected to a diffusion area and, therefore, is not subject to having any undesirable charge accumulating on the metal segments in that layer.

Various techniques have been employed to reduce or dissipate the electrostatic charge that builds up on susceptible metal lines to avoid damaging the connected transistor. A common charge dissipation technique is to build floating gate diodes on each conductor of the input/output (I/O) port of the hard macro that connects to a gate. The diodes slowly bleed off the electrostatic charge as it accumulates on the metal line. However, as circuit densities increase, it is more difficult to find sufficient surface area for locating floating gate diodes, whose only function is to protect the gates during manufacture. Furthermore, the floating gate diodes remain as permanent circuit elements and adversely affect the performance and power dissipation of the integrated circuit.

Full chip designs can be checked before implementation into silicon for potential problem areas where charge is likely to build up during fabrication. Problem areas are detected in accordance with an antenna rule. The antenna rule compares the surface area of a metallic conductor that is connected to a gate, and the actual gate area. If the comparison exceeds a threshold value the antenna rule is violated. The metal segments that do not pass the antenna rule, risk gate failures from excessive electrostatic charge.

When violations of the antenna rule are discovered, the design can be changed to provide different routing of the metal wiring connections such that violations of the antenna rule are avoided. This process of redesigning the layout to avoid the metal/gate area threshold violation is iterative in nature and requires numerous changes to the metal wire routing and several checks for each change.

In another method, disclosed in U.S. Pat. No. 6,194,233 B1, the segments that are identified as violating the antenna rule are modified to eliminate the violation. The disclosed method involves breaking the metalization segments violating the rule for each layer of metalization. The broken segments are rejoined by a bridge formed in an adjacent layer above the break in the segment.

In addition to being inefficient, the prior art methods for fixing antenna rule violations are not always successful due to their reliance on the checker for accurately detecting problematic segments that are subject to excessive electrostatic charge buildup. Mainly, the checker used to detect antenna rule violations is prone to error causing it to falsely detect antenna rule violations or fail to detect actual ones. This is primarily the result of the checker having inaccurate gate area data for the metallic conductor of the input/output (I/O) port of the hard macro. False detections of antenna rule violations result in time-consuming work to adjust a proper layout. The failure to detect an existing antenna rule violation can cause the corresponding gates of the hard macro to be damaged and, thus, cause the hard macro to fail and require the redesign of the layout to eliminate the antenna rule violation. As a result, the reliance of the prior art methods on the checker to accurately detect antenna rule violations can result in considerable delay in the completion of an antenna rule violation-free ASIC or, an ASIC that is subject to failure due to an antenna rule violation at the I/O port of the hard macro.

Therefore, a need exists for an improved hard macro design that eliminates antenna rule violations at the I/O port of the hard macro altogether thereby avoiding the reliance on accurate antenna rule violation detection.

SUMMARY OF THE INVENTION

The present invention is directed to an improved hard macro for use in an Application Specific Integrated Circuit (ASIC) that eliminates antenna rule violations. The hard macro of the present invention includes an I/O port having a port level metallic conductor of a low level metalization layer. An I/O transistor of the hard macro includes a gate conductor that is separated from a diffusion region by a gate oxide layer. The hard macro further includes an electrical connection between the port level metallic conductor and the gate conductor that includes a first conducting section extending from the gate conductor to a top level metallic conductor at a highest level metalization layer and a second conducting section extending from the top level metallic conductor layer to the port level conductor. Antenna rule violations at the I/O port of the hard macro are eliminated due to the electrical connection between the top level metallic conductor and a diffusion region.

In addition to eliminating antenna rule violations at the I/O port of the hard macro, the electrical connection between the port level metallic conductor and the gate conductor, failure analysis of the hard macro is enhanced due to the improved accessibility of the I/O ports of the hard macro.

DETAILED DESCRIPTION

The process of manufacturing a custom CMOS logic circuit in the ASIC environment involves several steps. First, the customer provides a net list to identify the functionality of the custom logic to the integrated circuit designers. Next, a floor plan for the custom logic circuit is created, which identifies the location of major circuit elements including hard macros and external circuit pads. The hard macros are typically major circuit components such as memory and processors, which are dropped in the floor plan to provide the desired function. Additional components, such as gates connecting the major components and a power bus comprising one or more levels of metalized circuit lines are laid out on the integrated circuit for routing operating voltages to the various components. The signals between components are routed via additional metalized circuit lines formed from metalization layers contained on the integrated circuit using a conventional routing tool. These steps complete the conventional design processes for defining the metalization layers, logic gates and component configuration for the integrated circuit.

Typical manufacturing processes next check the design for floating gate antenna rule violations. The determination of floating gate antenna rule violations is a conventional process step using conventional circuit checker tools. These tools generally determine, for each metalization layer connected to a transistor gate and not connected to a diffusion layer, the ratio of the entire connected metal area to gate area of all gates which are connected to a single electrically connected metal area. When the ratio exceeds a threshold value, the metal area and gate connection is deemed to fail the antenna rule. The checker then supplies the coordinates of an automatic wiring target or I/O port of the hard macro that is connected to the metalization segment, which has failed the antenna rule on the integrated circuit. In practice, it has been found that only those segments consisting of metallic circuit lines connected to the gate connection, which are also electrically connected to an input/output (I/O) port of a hard macro, are likely to produce an antenna violation.

Figure 1:
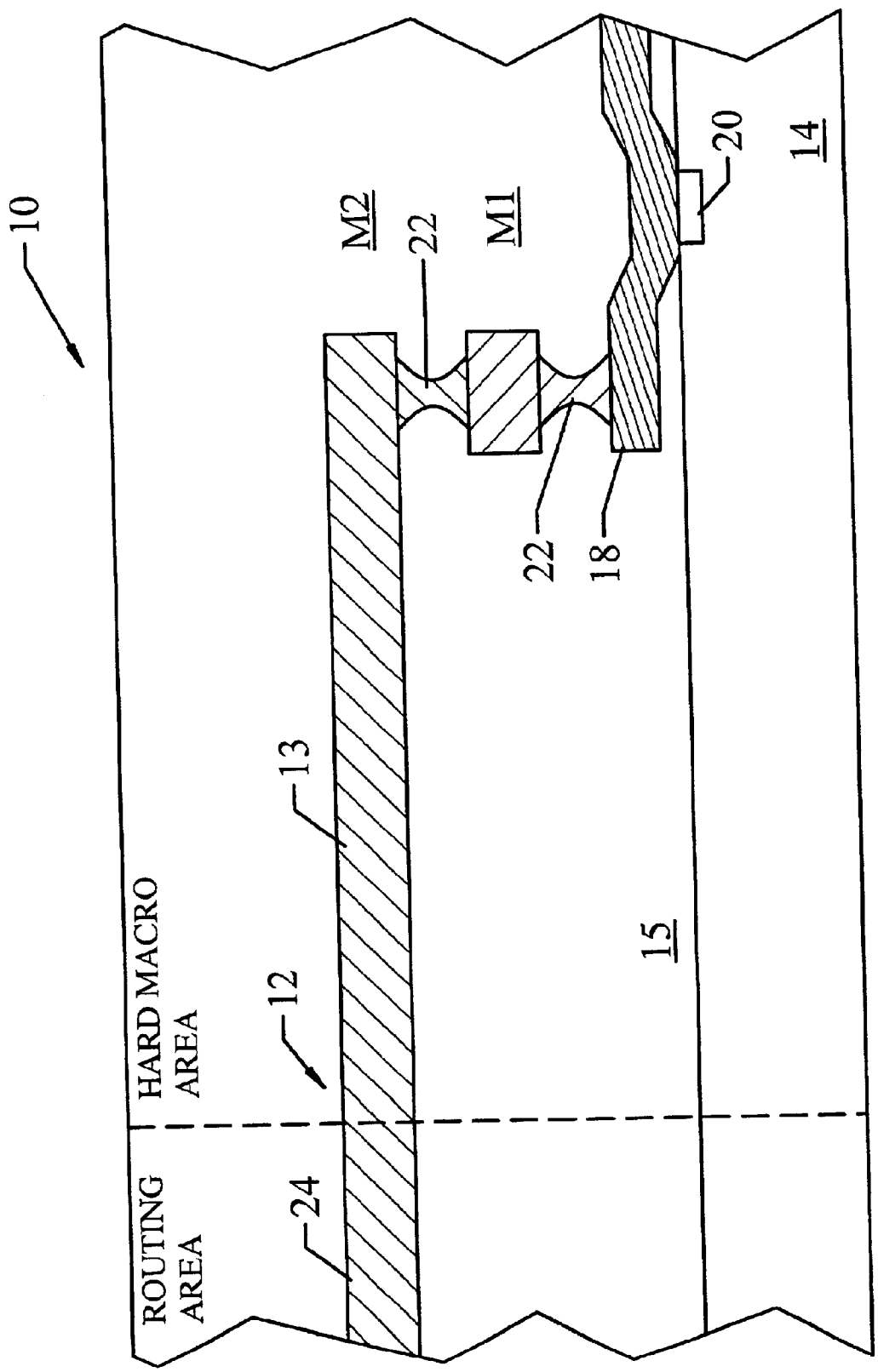
FIG. 1 is a side cross-sectional view of a portion of an integrated circuit design depicting an I/O port area of a hard macro in accordance with the prior art.

FIG. 1 is a cross-sectional view of an input/output (I/O) port of a hard macro 10 in accordance with prior art hard macro designs. Hard macro 10 is formed in a hard macro area and includes I/O port 12 having port level metallic conductor 13 of a low level metalization layer M2. The metalization layers, which are used to form electrical connections between the components of the integrated circuit, have a lowest metalizatlon layer M1, that is separated from silicon wafer 14 by silicon dioxide insulation layer 15. Hard macro 10 also includes an I/O transistor 16 having a gate conductor 18, which is separated from a diffusion region (not shown) by a gate oxide layer 20. An electrical connection is established between gate conductor 18 and port level metallic conductor 13 by the formation of vias 22, which extend vertically between gate conductor 18 and metalization layer M1 and between metalization layers M1 and M2. In this manner, gate conductor 18 is electrically coupled to I/O port 12, to which other components of the integrated circuit such as standard cells and other hard macros can be joined through circuit line 24.

Once the layout is completed, the design is typically checked for floating gate antenna rule violations. Since port level conductor 13 is not connected to a diffusion region or drain, electrostatic charge can accumulate on it during the manufacturing process. If a violation of the antenna rule is determined to occur at I/O port 12, one of the methods of the prior art discussed above can be used to eliminate the problem. Unfortunately, as mentioned above, those methods are not always successful at detecting antenna rule violations and, even if detected, the repair of an antenna rule violation can be difficult due to the limited area that is available to perform the fix. The present invention improves the design of the hard macro to eliminate antenna rule violations and, thus, the need to check for them.

Figure 2:
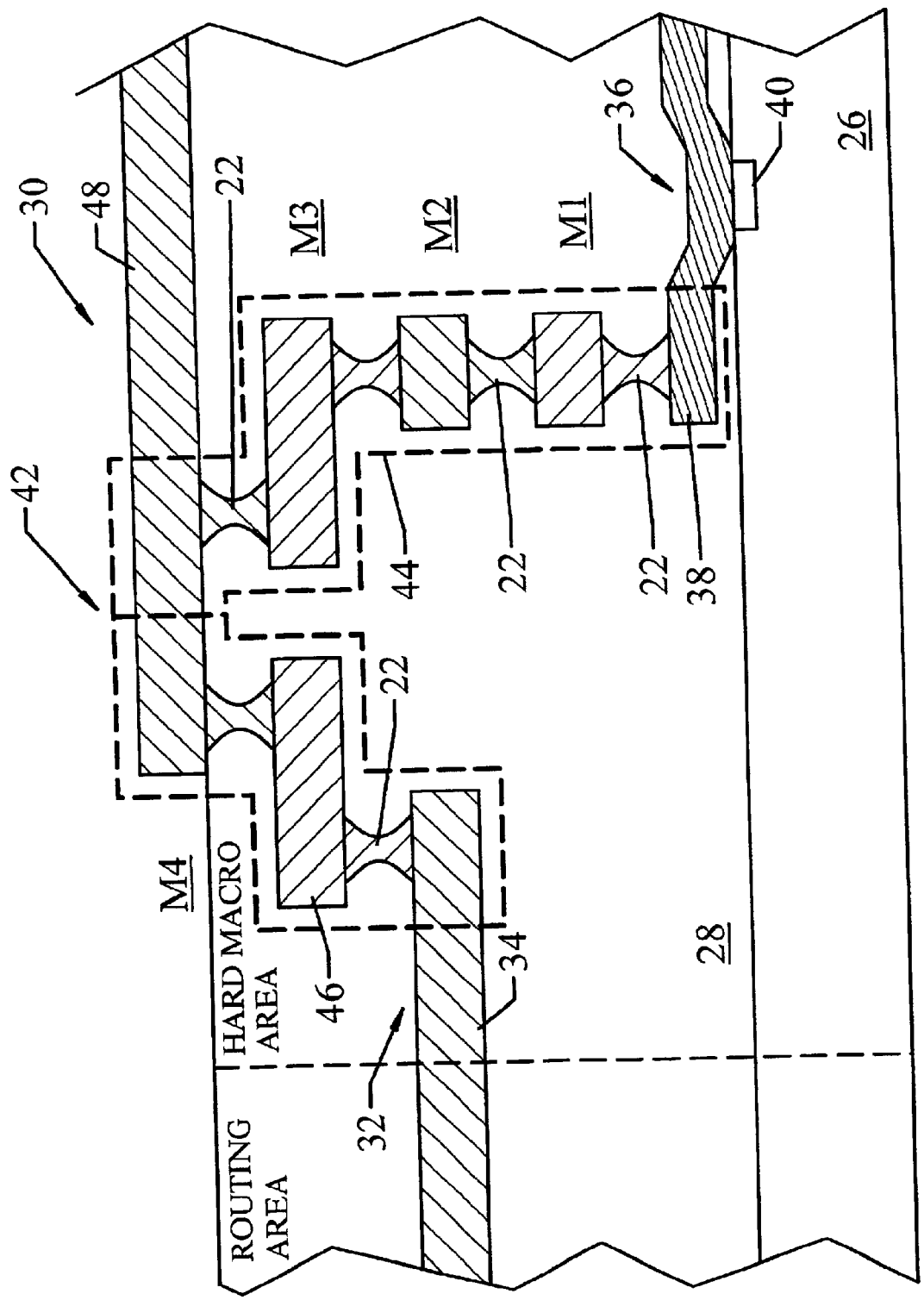
FIG. 2 is a side cross-sectional view of a portion of an integrated circuit design depicting an I/O port area of a hard macro in accordance with various embodiments of the present invention.

FIG. 2 is a cross-sectional view of a portion of an integrated circuit depicting hard macro 30, in accordance with various embodiments of the present invention. Although the depicted chip is shown as having four metalization layers (M1–M4), the design of the present invention can be applied to chips having more or fewer metalization layers. Hard macro 30 is located within a hard macro area and includes I/O port 32 having port level metallic conductor 34 formed in low level metalization layer M2. Hard macro 30 also includes I/O transistor 36 having gate conductor 38. Gate conductor 38 is separated from a diffusion region (not shown) by gate oxide layer 40.

The present invention eliminates antenna rule violations resulting from chip level routing by providing electrical connection 42 between port level metallic conductor 34 and gate conductor 38. Electrical connection 42 routes signals to the highest level metalization layer (M4) at an intermediary position. The top level metalization layer (M4) is always connected to a diffusion region or drain (not shown). Since the metal area hanging on gate conductor 38 is minimized and is directly connected to the highest level metalization layer (M4) and, thus, a drain, antenna rule violations are avoided.

Electrical connection 42 generally includes first and second conducting sections 44 and 46, respectively. The first connecting section 44 extends from gate conductor 38 to top level metallic conductor 48 positioned at the highest level metalization layer M4. Second conducting section 46 extends from port level conductor 34 to top level metallic conductor 48. Vias 22 extend vertically to electrically couple adjacent metalization layers (M1–M4) in the first and second conducting sections 44 and 46 where needed.

Electrical connection 42 of the present invention eliminates antenna rule violations at port 32 of hard macro 30 that may occur due to a large metal area, such as port level metallic conductor 14 of FIG. 1, being coupled to gate conductor 18 prior to its connection to a diffusion region or drain. As a result, unlike the prior art, the need to check the circuit layout for antenna rule violations produced by such a large metal area is no longer necessary. In addition, electrical connection 42 provides convenient access to the I/O ports of the hard macro thereby providing convenient access to the hard macro ports to allow for failure analysis work.

Although the present invention has been described with reference to preferred embodiments, workers skilled in the art will recognize that changes may be made in form and detail without departing from the spirit and scope of the invention.

What is claimed is:

1. A hard macro having an antenna rule violation free input/output port, comprising:

an input/output (I/O) port having a port level metallic conductor in a low level metalization layer;

an I/O transistor having a gate conductor separated from a diffusion region by a gate oxide layer;

a top level metallic conductor of a highest level metalization layer that is electrically coupled to a diffusion region; and an electrical connection between the port level metallic conductor and the gate conductor including a first conducting section extending from the gate conductor to the top level metallic conductor and a second conducting section extending from the top level metallic conductor to the port level conductor;

wherein the I/O port is free of antenna rule violations, and the I/O port, the I/O transistor, the top level metallic conductor, and the electrical connection form a predefined circuit element that is droppable into a floor plan of a circuit design.

2. The hard macro of claim 1, wherein the first and second conducting sections include a plurality of vias extending vertically between adjacent metalization layers.

3. The hard macro of claim 1, wherein the hard macro is selected from a group consisting of a processor, memory, an input interface circuit, an output interface circuit, an encoder, and a decoder.

4. A method of defining a hard macro having an antenna rule violation free input/output port, comprising steps of:
   (a) defining an input/output (I/O) port having a port level conductor in a low level metalization layer;
   (b) defining an I/O transistor having a gate conductor separated from a diffusion region by a gate oxide layer;
   (c) defining a top level metallic conductor in a highest level metalization layer that is electrically coupled to a diffusion region;
   (d) defining a first conducting section of an electrical connection extending from the gate conductor to the top level metallic conductor; and
   (e) defining a second conducting section of the electrical connection extending from the top level metallic conductor to the port level conductor;
   wherein the defined I/O port is free of antenna rule violations, and the defined I/O port, transistor, top level metallic conductor, and electrical connection form a predefined circuit element that is droppable into a floor plan of a circuit design.

5. An integrated circuit including a plurality of hard macros, each hard macro comprising:
   an input/output (I/O) port having a port level metallic conductor in a low level metalization layer;
   an I/O transistor having a gate conductor separated from a diffusion region by a gate oxide layer;
   a top level metallic conductor of a highest level metalization layer that is electrically coupled to a diffusion region; and
   an electrical connection between the port level metallic conductor and the gate conductor including a first conducting section extending from the gate conductor to the top level metallic conductor and a second conducting section extending from the top level metallic conductor to the port level conductor;
   wherein the I/O port is free of antenna rule violations, and the I/O port, the I/O transistor, the top level metallic conductor, and the electrical connection form a predefined circuit element that is droppable into a floor plan of a circuit design.

* * * * *